United States Patent
Brush (10) Patent No.: US 11,428,732 B2
(45) Date of Patent: Aug. 30, 2022

(54) SELF-CALIBRATING DESKEW FIXTURE

(71) Applicant: Keysight Technologies, Inc., Santa Rosa, CA (US)

(72) Inventor: Edward Vernon Brush, Colorado Springs, CO (US)

(73) Assignee: Keysight Technologies, Inc., Santa Rosa, CA (US)

(*) Notice: Subject to any disclaimer, the term of this patent is extended or adjusted under 35 U.S.C. 154(b) by 332 days.

(21) Appl. No.: 16/553,611

(22) Filed: Aug. 28, 2019

(65) Prior Publication Data

US 2021/0063475 A1   Mar. 4, 2021

(51) Int. Cl.
*G01R 31/28* (2006.01)
*H03L 7/085* (2006.01)
*G01R 31/317* (2006.01)

(52) U.S. Cl.
CPC .......... *G01R 31/2853* (2013.01); *H03L 7/085* (2013.01); *G01R 31/2879* (2013.01); *G01R 31/31701* (2013.01); *G01R 31/31725* (2013.01)

(58) Field of Classification Search
CPC ............ G01R 1/06772; G01R 13/0254; G01R 31/2853; G01R 31/2879; G01R 31/31701; G01R 31/31725; G01R 35/005; G01R 31/3016; G01R 31/31723; G01R 31/318511; G01R 31/3191; G01R 31/31937; G01R 1/073; G01R 1/28; G01R 1/30; H03L 7/085; G06K 5/04; H04L 12/28; H04L 2025/03477; H04L 2025/03617; H04L 25/03006; H04L 25/03885; H04L 7/0025; H04L 7/0274; H04L 7/0337; H04L 25/03038
See application file for complete search history.

(56) References Cited

U.S. PATENT DOCUMENTS

| | | | |
|---|---|---|---|
| 5,880,612 A | 3/1999 | Kim | |
| 6,614,221 B2 | 9/2003 | Cushing et al. | |
| 6,784,819 B2 * | 8/2004 | Chow | H03M 1/0836 324/532 |
| 6,801,042 B2 * | 10/2004 | Mc Pherson | G01R 35/02 324/601 |

(Continued)

FOREIGN PATENT DOCUMENTS

CN   112444768 A1   3/2021

Primary Examiner — Vinh P Nguyen (57) ABSTRACT

A deskew fixture includes first and second deskew probe points for contacting first and second probes, respectively, during deskew calibration, a signal generating circuit for generating a calibration signal provided to the first and second deskew probe points, and a feedback loop for automatically self-calibrating the deskew fixture. The feedback loop includes first and second analog to digital converters (ADCs) for digitizing the calibration signal at the first and second deskew probe points while contacting the first and second probes, respectively, to provide first and second digitized calibration signals, and a processing unit programmed to determine inherent skew of the deskew fixture between the first and second skew probe points using the first and second digitized calibration signals, and to provide the determined inherent skew to a test instrument for use in the deskew calibration of the first and second probes.

20 Claims, 3 Drawing Sheets

(56) References Cited

U.S. PATENT DOCUMENTS

| | | | | |
|---|---|---|---|---|
| 6,981,192 | B2* | 12/2005 | Panis | G01R 31/31924 |
| | | | | 714/700 |
| 7,023,252 | B2 | 4/2006 | Schultz | |
| 7,463,015 | B2* | 12/2008 | Mende | G01R 1/06772 |
| | | | | 324/754.01 |
| 7,595,629 | B2* | 9/2009 | Miller | G01R 35/005 |
| | | | | 324/750.02 |
| 7,768,255 | B2* | 8/2010 | Takizawa | G01R 31/31725 |
| | | | | 324/754.07 |
| 7,973,541 | B2 | 7/2011 | Jayapalan et al. | |
| 8,050,372 | B2* | 11/2011 | Lee | H03L 7/0812 |
| | | | | 375/355 |
| 8,103,473 | B2* | 1/2012 | Acuff | G01R 31/3177 |
| | | | | 702/107 |
| 9,140,723 | B2* | 9/2015 | Booman | G01R 1/06766 |
| 10,145,822 | B2* | 12/2018 | Knierim | G01R 1/06772 |
| 11,047,881 | B2* | 6/2021 | Bresser | G01R 1/07307 |
| 11,119,120 | B2* | 9/2021 | Swaim | G01R 21/06 |
| 2018/0088151 | A1 | 3/2018 | Rowland | |
| 2021/0063475 | A1 | 3/2021 | Brush | |

* cited by examiner

SELF-CALIBRATING DESKEW FIXTURE

BACKGROUND

A deskew fixture is an electrical circuit, attachable to signal probes, such as current and voltage probes, for eliminating timing differentials (skew) between signals provided by the signal probes, respectively. For example, skew may be timing delay of rising edges between real signals and acquired signals, which leads to distortion and inaccurate measurement due to the internal circuitry of the signal probes. Skew may be caused by manufacturing, design and/or architectural variation between the signaling probes.

To obtain accurate measurements, such as power measurements, the probes (e.g., a current probe and a voltage probe) must be deskewed using a deskew fixture during calibration. Conventional deskew fixtures, such as U1880A Power Measurement Deskew Fixture, available from Keysight Technologies, enable a user to double probe the same signal in close physical proximity with the voltage and current probes in order to measure and eliminate any skew between two probe channels and/or between two test instrument channels or inputs (e.g., oscilloscope channels) to which the probes are connected. However, it is preferable to measure the voltage and the current at the same time using simultaneously connected voltage and current probes. In this case, the deskew fixtures do not use the same probe point location (electrical length) for both the voltage and current probes, and do not provide a way to calibrate out inherent skew between the probe points. Thus, deskewing the probes is important for applications that are sensitive to timing, such as power measurements. The accuracy of the power measurements depends in large part on the accuracy of the deskew between the voltage and current probes.

Generally, conventional deskew fixtures use one electrical signal that can be probed by two probes. When the signal is generated on the deskew fixture, the signal generation is limited and often does not adequately accommodate probes having different bandwidths and input levels. Also, there are no controls over parameters of the signals, such as wave shape and amplitude. For example, with regard to the U1880A Power Measurement Deskew Fixture, the signal is generated from a 555 clock IC that produces a square wave of one type (frequency and amplitude). It may be difficult to use one waveform type to deskew probes that have inherently different bandwidths. In comparison, where the signal is generated externally to the deskew fixture, the user may not know the signal types being produced, and may not have the equipment to generate the proper signals. For example, an external signal generator may have adequate bandwidth, but may output insufficient current.

In addition, conventional deskew fixtures do not generate adequate current levels, and therefore may include multiple windings to increase the effective current. The windings introduce inductance, which may cause unwanted phase shifts, making it more difficult for the output driver to maintain linearity.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

Unless otherwise noted, when a first element is said to be connected to a second element, this encompasses cases where one or more intermediate elements may be employed to connect the two elements to each other. However, when a first element is said to be directly connected to a second element, this encompasses only cases where the two elements are connected to each other without any intermediate or intervening devices. Similarly, when a signal is said to be coupled to an element, this encompasses cases where one or more intermediate elements may be employed to couple the signal to the element. However, when a signal is said to be directly coupled to an element, this encompasses only cases where the signal is directly coupled to the element without any intermediate or intervening devices.

As used in the specification and appended claims, the terms "a", "an" and "the" include both singular and plural referents, unless the context clearly dictates otherwise. Thus, for example, "a device" includes one device and plural devices. As used in the specification and appended claims, and in addition to their ordinary meanings, the terms "substantial" or "substantially" mean to within acceptable limits or degree. As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Relative terms, such as "above," "below," "top," "bottom," may be used to describe the various elements" relationships to one another, as illustrated in the accompanying drawings. These relative terms are intended to encompass different orientations of the elements thereof in addition to the orientation depicted in the drawings. For example, if an apparatus (e.g., a signal measurement device) depicted in a drawing were inverted with respect to the view in the drawings, an element described as "above" another element, for example, would now be "below" that element. Similarly, if the apparatus were rotated by 90° with respect to the view in the drawings, an element described "above" or "below" another element would now be "adjacent" to the other element; where "adjacent" means either abutting the other element, or having one or more layers, materials, structures, etc., between the elements.

Generally, a test instrument (e.g., an oscilloscope) may be used to measure time variant characteristics, such as voltage, current and/or power, of a device under test (DUT) using two or more probes connected to channels of the test instrument. The test instrument initially performs deskewing calibration of the probes before they are used to measure the DUT. The deskewing calibration accounts for differences in timing (skew) between signals respectively provided by the probes so that subsequent measurements of the DUT by the probes are aligned in time (deskewed). To the deskewing calibration, the test instrument is connected to a deskew fixture, according to various embodiments, while the probes are situated to contact corresponding deskew probe points on the deskew fixture. A calibration signal, generated by an integrated signal generating circuit of the deskew fixture, is applied to the probe points. The test instrument receives signals from the probes and timing information from the deskew fixture that enables it to determine the skew between the probes, and to calculate a deskew function to eliminate the skew. According to various embodiments, the timing information from the deskew fixture includes deskewing information that accounts for skew introduced by the deskew fixture itself during the deskewing calibration of the probes. The test instrument is therefore able to perform a more accurate deskewing calibration, as compared to conventional deskewing calibration techniques, which do not account for skewing introduced by a conventional deskew fixture.

Figure 1:
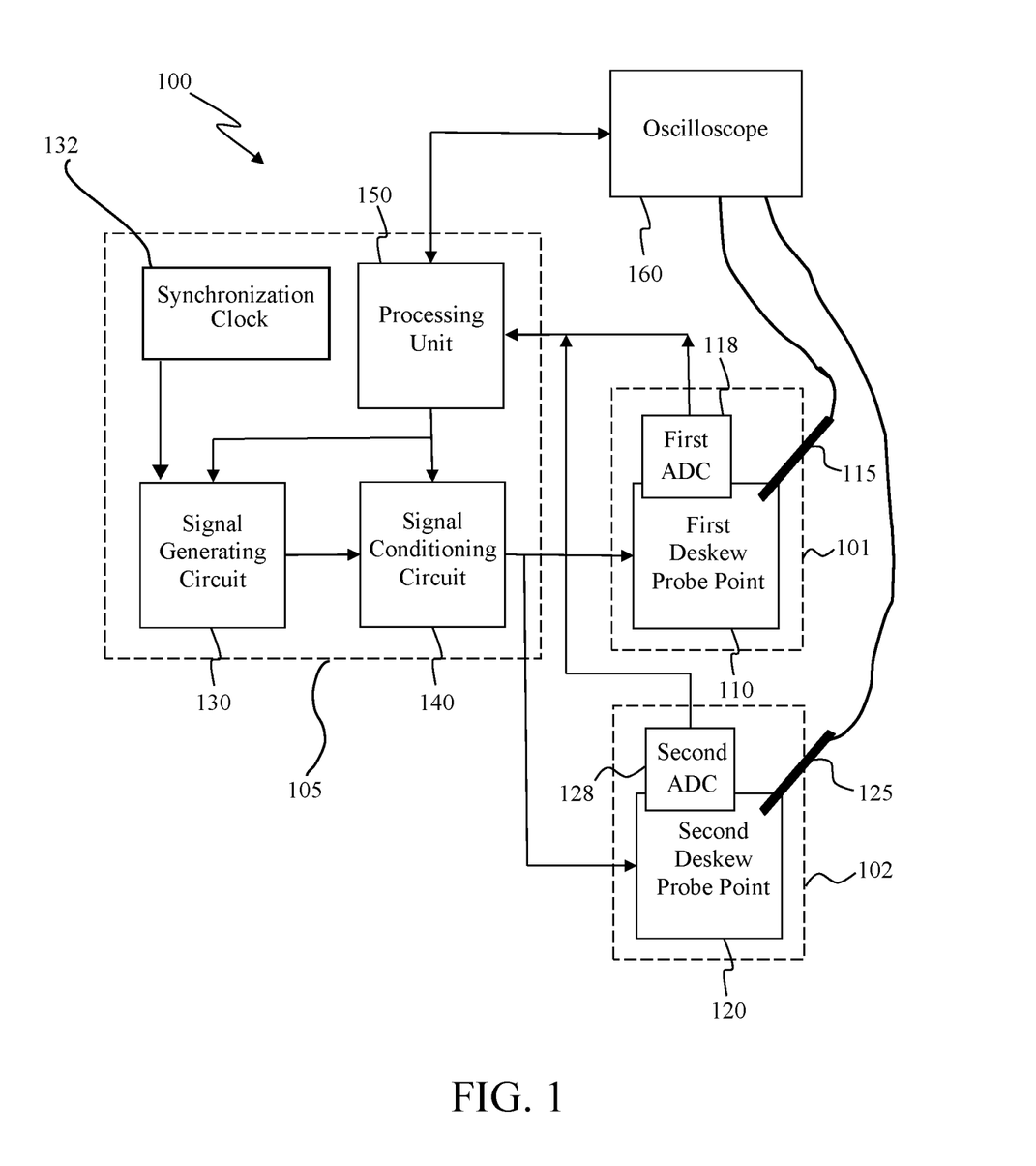
FIG. 1 is a simplified block diagram of a deskew fixture with self-calibration, according to a representative embodiment.

FIG. 1 is a simplified block diagram of a deskew fixture with self-calibration, according to a representative embodiment.

Referring FIG. 1, deskew fixture 100 includes a first deskew probe point 110 and a second deskew probe point 120 configured to contact a first probe 115 and a second probe 125, respectively. The first probe 115 may be connected to a first channel of test instrument 160, and the second probe 125 may be connected to a second channel of test instrument 160. The test instrument 160 may be implemented as any type of test instrument compatible with the first and second probes 115 and 125, such as an oscilloscope, a network analyzer or a power analyzer, for example. The deskew fixture 100 further includes an integrated signal generating circuit 130, a signal conditioning circuit 140 and a processing unit 150.

The test instrument 160 is configured to perform deskewing calibration of the first and second probes 115 and 125, which includes accounting for skew introduced by the deskew fixture 100. This deskewing calibration enables the test instrument 160 to accurately deskew signals through the first and second probes 115 and 125 during subsequent testing of a DUT (not shown). For purposes of illustration, the first probe 115 may be a voltage probe and the second probe 125 may be a current probe, although the deskew fixture 100 is able to accommodate other types and combinations of probes, without departing from the scope of the present teachings. For example, both of the first and second probes 115 and 125 may be voltage probes or both of the first and second probes 115 and 125 may be current probes.

The first deskew probe point 110 is connected to a first analog to digital converter (ADC) 118, and the second deskew probe point 120 is connected to a second ADC 128 of the deskew fixture 100. The first ADC 118 digitizes the calibration signal sampled at the first deskew probe point 110 to provide a first digitized calibration signal, and the second ADC 128 digitizes the calibration signal sampled at the second deskew probe point 120 provide a second digitized calibration signal. The first and second ADCs 118 and 128 are shown collocated with the first and second deskew probe points 110 and 120, respectively, so that the timing of the calibration signal arriving at the first ADC 118 is substantially the same as that of the calibration signal arriving at the first deskew probe point 110, and the timing of the calibration signal arriving at the second ADC 128 is substantially the same as that of the calibration signal arriving at the second deskew probe point 120. The first and second ADCs 118 and 128 need not be collocated with the respective first and second deskew probe points 110 and 120, although generally the closer they are to the first and second deskew probe points 110 and 120, respectively, the more accurate the deskewing. The deskew fixture 100 may further include a synchronized clock 132 configured to provide synchronization between the signal generating circuit 130 and each of the first and second ADCs 118 and 128.

The first and second ADCs 118 and 128 provide timing with the digitized calibration signals, enabling automatic self-calibration of the deskew fixture 100, as discussed below with reference to the processing unit 150. Generally, the self-calibration eliminates inherent skew between the two physical locations of the first and second deskew probe points 110 and 120, making the final deskew calibration performed by the test instrument 160 more accurate. Also, the self-calibration allows for wide variation in the physical locations of the first and second deskew probe points 110 and 120, eliminating the requirement in conventional deskew fixtures that the deskew probe points be in close proximity. Accordingly, the self-calibration provides the ability for the deskew fixture 100 to know when the calibration signal arrives at the first and second deskew probe points 110 and 120, and to remove automatically skew errors inherent to the deskew fixture 100.

In an embodiment, one or both of the first and second deskew probe points 110 and 120 are modular, indicated by first probe point module 101 and second probe point module 102, in that they are removably connected to a base 105 of the deskew fixture 100. The first probe point module 101, the second probe point module 102, and the base 105 are indicated by dashed lines to the extent they are optional. The first probe point module 101 and the second probe point module 102 are removably connected to the base 105 using a first connector and a second connector (not shown), respectively. For example, the first and second connectors may be high-quality RF connectors, such as a subminiature version A (SMA) connector, a micro coaxial connector (MCX) connector or a micro-miniature coaxial (MMCX) connector, for example, particularly for probes needing large amplitude signals to be properly deskewed.

In an embodiment, the first and second probe point modules 101 and 102 may include digital connectors in addition to the RF connectors, so that auxiliary digital signals may be sent to the processing unit 150, enabling automatic detection and configuration of the first and second probe point modules 101 and 102. In addition, the processing unit 150 may be programmed to identify the types of module, and may pass the information to the test instrument 160. Identification of the type of module may be performed by using a resistor value and lookup table, for example, and/or using the auxiliary digital signals.

The first and second probe point modules 101 and 102 may be different physical sizes, and/or may include first and second deskew probe points 110 and 120 having different physical sizes and form factors, for accommodating different types, bandwidths and/or sizes of probes that may be connected to the test instrument 160. That is, one or both of the first and second probe point modules 101 and 102 may be customized according to geometrical and RF characteristics of the first and second probes 115 and 125, respectively. The deskew fixture 100 supports arbitrary probe geometries, allowing first and second probes 115 and 125 to fit precisely and more conveniently, yielding more accurate and repeatable deskew measurements. Further, this architecture allows the physical locations of the first and second deskew probe points 110 and 120 to be decoupled from the circuit. The self-calibration discussed above enables use of the different sized first and second probe point modules 101 and 102 since, without self-calibration, the first and second probe point modules 101 and 102 may introduce excessive, uncorrectable error due to skew. Also, unlike conventional deskew fixtures, the deskew fixture 100 may be used for measuring high frequency current probes (e.g., frequencies greater than 100 MHz) using a corresponding first or second deskew probe point 110 or 120. In this case, the signal generating circuit 130 would be configured to generate high frequency calibration signals, and the signal conditioning circuit 140 would be configured to support the additional bandwidth of the high frequency calibration signals.

Also, in the depicted embodiment, the first ADC 118 is on the first probe point module 101 with the first deskew probe point 110, and the second ADC 128 is on the second probe point module 102 with the second deskew probe point 120. This configuration enables the first and second ADCs 118 and 128 to be in close proximity to the first and second deskew probe points 110 and 120, respectively, which in turn reduces or prevents effects of additional skew based on the relative locations of the first and second ADCs 118 and 128. In addition, the first and second ADCs 118 and 128 may have various characteristics (e.g., sampling rate) that are specifically directed to complement characteristics of the first and second deskew probe points 110 and 120. In alternative embodiments, the first and second ADCs 118 and 128 may be included in the base 105 of the deskew fixture 100, as opposed to being modular.

The signal generating circuit 130 may be a signal generator, an arbitrary waveform generator (AWG) or other RF signal source, for example, the output of which is controllable by a user and/or the processing unit 150. The signal generating circuit 130 generates an electrical calibration signal that is applied to the first and second deskew probe points 110 and 120 through the signal conditioning circuit 140. In an embodiment, the characteristics of the calibration signal generated by the signal generating circuit 130 may be controlled by signal generation and/or signal conditioning input from the test instrument 160.

When implemented as a signal generator, the signal generating circuit 130 generates sine waves, for example, as the calibration signal. The user is able to control basic characteristics of the sine waves, such as amplitude and frequency. When implemented as an AWG, the signal generating circuit 130 is able to generate a large variety of calibration signals, enabling substantial customization of calibration signal characteristics, including amplitude, frequency, shape, bandwidth and risetime, for example. This, in turn, enables very accurate deskewing calibration for different probe types and different applications. For example, the signal generating circuit 130 may be controlled to generate a calibration signal having a low repetition rate, which is useful for coarse deskew adjustments. Further, the signal generating circuit 130 may be controlled to generate square waves for broadband signals, and sine waves varied in frequency across the bandwidth for improving overall accuracy. The AWG may also be controlled to generate a custom calibration signal that is similar to or the same as the anticipated signal on the DUT. Generally, the ability to adapt the calibration signal for different probes and/or different applications enables optimization of deskew performance.

The signal conditioning circuit 140 is configured to condition the calibration signal output by the signal generating circuit 130, for example, to provide a stronger or more ideal calibration signal to the first and second deskew probe points 110 and 120. For example, the signal conditioning circuit 140 may amplify the calibration signal thereby eliminating the need for inductive windings, and/or may reduce skewing between the first and second deskew probe points 110 and 120 up front, thereby minimizing the deskewing to be performed by the test instrument 160. The signal conditioning circuit 140 may include one or more of an amplifier, a low pass filter, a band pass filter, a delay line and a risetime converter, discussed below with reference to FIG. 2. The amplifier may be a variable gain amplifier (VGA), for example, configured to increase the power of the calibration signal before being applied to the first and second deskew probe points 110 and 120, under control of the processing unit 150. The low pass and band pass filters are configured to pass only certain frequencies of the calibration signal. The delay line is connected between the signal generating circuit 130 and one of the first and second deskew probe points 110 and 120, in order to delay arrival of the calibration signal to the one of the first and second deskew probe points 110 and 120. Accordingly, much of the time delay (skew) between the first and second deskew probe points 110 and 120 may be removed prior to processing by the processing unit 150, discussed below. The risetime converter is configured to adjust pulsed edge risetimes of the calibration signal in accordance with the bandwidth of the first probe 115 and/or the second probe 125. Notably, to the extent the first and second deskew probe points 110 and 120 are modular, the signal generating circuit 130 and/or the signal conditioning circuit 140 may be adjusted to account for form factor variations of the first and second probe point modules 101 and 102.

The processing unit 150 may include one or more processor devices, such as field programmable gate arrays (FPGAs), application specific integrated circuits (ASICs), digital signal processors (DSPs), microprocessors, computer processors, or combinations thereof, using any combination of hardware, software, firmware, hard-wired logic circuits, or combinations thereof. The processing unit 150 may include its own memory (e.g., volatile and/or nonvolatile memory) for storing software instructions and/or computer readable code that enables performance of the various functions described herein. For example, the memory may store software instructions/computer readable code executable by the processing unit (e.g., computer processor) for performing some or all aspects of functions and methods described herein.

The memory may be implemented by any number, type and combination of random access memory (RAM) and read-only memory (ROM), for example, and may store various types of information, such as software algorithms and computer programs executable by the processing unit 150. The various types of ROM and RAM may include any number, type and combination of computer readable storage media, such as a disk drive, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of storage medium known in the art, which are tangible and non-transitory storage media (e.g., as compared to transitory propagating signals).

The processing unit 150 may further include a user interface for providing information and data to the user and/or for receiving information and data from the user. That is, the user interface enables the user to enter data and to control or manipulate aspects of the deskew fixture 100 (e.g., the signal generating circuit 130, the signal conditioning circuit 140 and/or the processing unit 150), and also enables the processor device(s) to indicate the effects of the user's control or manipulation. The user interface may provide information and data to the user via a display, which may include a graphical user interface. The user interface may receive information and data from the user via one or more of a keyboard, a mouse, a trackball, a joystick, a touchpad, and a touch screen, for example.

The processing unit 150 is programmed to determine the inherent skew of the deskew fixture 100 between the first and second deskew probe points 110 and 120 caused by physical separation. The processing unit 150 provides deskew information regarding the skew determination to the test instrument 160. The test instrument 160 then performs deskew calibration of the first and second probes 115 and 125 using one of well known deskew algorithms, and adjusts the deskew calibration using the deskew information provided by the deskew fixture 100 to compensate for the inherent skew between the first and second deskew probe points 110 and 120. For example, assuming it is determined that the second deskew probe point 120 lags the first deskew probe point 110 by 1 nanosecond (ns), the processing unit 150 communicates this determination to the test instrument 160 in the deskew information. When performing the deskew calibration of the first and second probes 115 and 125, the test instrument 160 references the deskew information and, based on the same, adds an additional 1 ns to the overall skew of the first probe 115, thereby accounting for the inherent skew in the deskew fixture 100.

The processing unit 150 may also be programmed to adjust parameters of the signal generating circuit 130 and/or the signal conditioning circuit 140, in response to the determined inherent skew of the deskew fixture 100, in order to reduce or eliminate the skew between the first and second deskew probe points 110 and 120. In this case, the processing unit 150, the first ADC 118 and the second ADC 128 effectively form a feedback loop for reducing or eliminating the inherent skew. That is, the processing unit 150 receives the first and second digitized calibration signals and corresponding timing information from the first and second ADCs 118 and 128, and determines skew between the first and second digitized calibration signals by comparing the timing between the first and second deskew probe points 110 and 120. In response to the feedback, the processing unit 150 may send control signals to the signal generating circuit 130 and/or the signal conditioning circuit 140 to adjust the respective parameters to reduce or eliminate the skew.

For example, again assuming it is determined that the second deskew probe point 120 lags the first deskew probe point 110 by 1 ns, the processing unit 150 may adjust the signal generating circuit 130 to generate a second calibration signal to be applied to the second deskew probe point 120 1 ns before it generates a first calibration signal to be applied to the first deskew probe point 110 (e.g., assuming the signal generating circuit 130 includes two AWGs or signal generators). Accordingly, the first and second calibration signals will arrive at the first and second deskew probe points 110 and 120 at the same time. Alternatively, the processing unit 150 may adjust delay in one of the signal paths of the signal conditioning circuit 140 to reduce skew between the first and second deskew probe points 110 and 120. That is, the processing unit 150 may adjust a delay line to the first deskew probe point 110 to add a 1 ns delay, causing the first and second calibration signals to arrive at the first and second deskew probe points 110 and 120 at the same time.

To the extent that inherent skew may be removed from the deskew fixture 100 by the adjustments made by the signal generating circuit 130 and/or the signal conditioning circuit 140, the deskew calibration need not be performed by the test instrument 160. Thus, in this case, the test instrument 160 does not need the deskew information about the deskew fixture 100 from the processing unit 150, and can therefore use a traditional deskew algorithm (that does not otherwise account for the inherent skew of the deskew fixture 100) for performing deskew calibration on the first and second probes 115 and 125. This is useful when the test instrument 160 does not support the data communications with the deskew fixture. In an embodiment, both the feedback loop and the test instrument 160 may be used to compensate for the inherent skew, where the feedback loop substantially reduces the inherent skew, and information regarding any remaining skew is provided to the test instrument 160, which accounts for the remaining inherent skew when calibrating the first and second probes 115 and 125.

Although shown in the deskew fixture 100, it is understood that the processing unit 150, and all or part of the processing performed by the processing unit 150, may be included in the test instrument 160 instead of the deskew fixture 100, without departing the scope of the present teachings. That is, the processing unit 150 may be implemented by a processing unit within the test instrument 160 itself, or one or more functions that the processing unit 150 is programed to perform may be performed by the processing unit within the test instrument 160. In this case, the deskew information provided by the deskew fixture 100 to the test instrument 160 via a digital connection includes the first and second digitized calibration signals provided by the first and second ADCs 118 and 128. The test instrument 160 then determines the inherent skew of the deskew fixture 100 using the first and second digitized calibration signals retrieved from the deskew information.

In various embodiments, one or more of the signal generating circuit 130, the signal conditioning circuit 140 and the processing unit 150 may be modular, in addition to or instead of the first and second deskew probe points 110 and 120, discussed above. For example, a modular signal generating circuit 130 may be changed to provide different types of calibration signals for different probes, such as calibration signals having higher speed and/or frequencies. Also, all or a portion of a modular signal conditioning circuit 140 may be changed to provide higher amplitudes through different amplifiers, for example.

Figure 2:
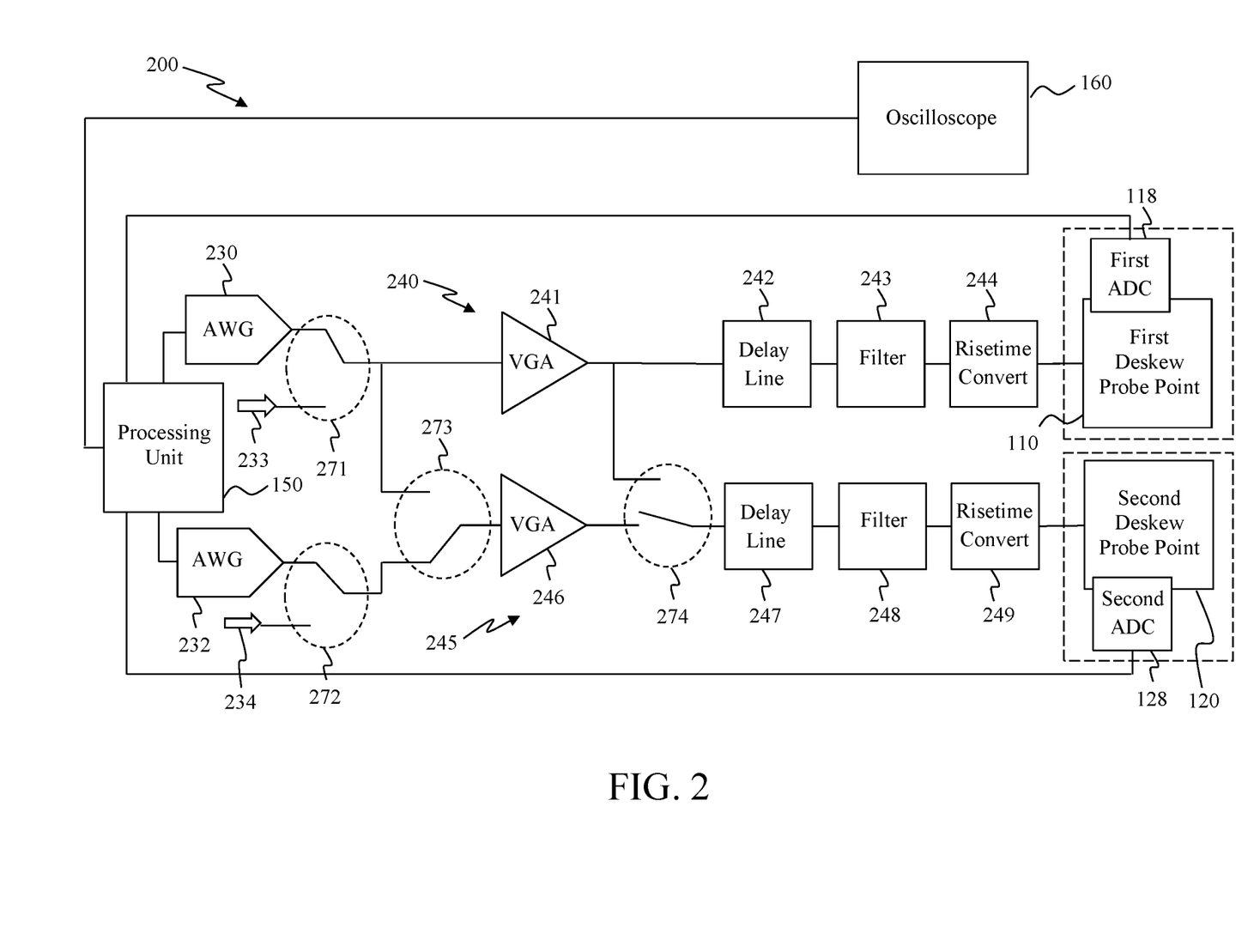
FIG. 2 is a simplified block diagram of a deskew fixture with self-calibration, according to a representative embodiment.

FIG. 2 is a simplified block diagram of a deskew fixture including self-calibration, according to a representative embodiment, in which the test fixture includes or otherwise has access to multiple signal generating circuits. The deskew fixture of FIG. 2 also includes signal conditioning circuits, which may be provided in various combinations.

Referring to FIG. 2, deskew fixture 200 includes first deskew probe point 110 connected to first ADC 118, and second deskew probe point 120 connected to second ADC 128. Optionally, the first deskew probe point 110 and the first ADC 118 may be included in the first probe point module 101, and the second deskew probe point 120 and the second ADC 128 may be included in the second probe point module 102, as discussed above. A first probe (e.g., first probe 115) to be calibrated contacts the first deskew probe point 110 and a second probe (e.g., second probe 125) to be calibrated contacts the second deskew probe point 110, where the first probe is connected to a first channel of the test instrument 160 and the second probe is connected to a second channel of the test instrument 160.

The deskew fixture 200 includes two integrated signal generating circuits, depicted as a first AWG 230 and a second AWG 232, which may be controllable by the processing unit 150, for generating a first calibration signal and a second calibration signal, respectively. Each of the first and second AWGs 230 and 232 is able to generate types of calibration signals, enabling substantial customization of calibration signal characteristics, including amplitude, frequency, shape, bandwidth and risetime, for example, as discussed above. In addition, the deskew fixture 200 includes a first signal input 233 and a second signal input 234, which may be used to connect the deskew fixture 200 to external signal generating circuits (not shown), such as signal generators and/or additional AWGs. A switch 271 selectively connects one of the first AWG 230 and the first signal input 233, and a switch 272 selectively connects one of the second AWG 232 and the second signal input 234. The positions of the switches 271 and 272 may be controlled by the processing unit 150, for example, either automatically or by the user interfacing through the processing unit 150. In alternative embodiments, the deskew fixture 200 may include only one of the first and second AWGs 230 and 232, or may include additional integrated AWGs or other types of signal generating circuits, without departing from the scope of the present teachings. Also, one or both of the first and second AWGs 230 and 232 may be replaced by signal generators or other types of signal generating circuits. In addition, in alternative embodiments, one or both of the first and second signal inputs 233 and 234 may be excluded, in which case, the corresponding switches 271 and 272, respectively, would likewise be excluded.

The deskew fixture 200 further includes two sets of signal conditioning circuits, each of which may be implemented as the signal conditioning circuit 140, discussed above. A first signal conditioning circuit 240 includes any combination of a first VGA 241, a first delay line 242, a first filter 243 and a first risetime converter 244, and a second signal conditioning circuit 245 includes any combination of a second VGA 246, a second delay line 247, a second filter 248 and a second risetime converter 249. The first signal conditioning circuit is selectively connectable to the first AWG 230 (or the first signal input 233) by the switch 271 located between the first AWG 230 and the first VGA 241. Also, in the depicted embodiment, the second signal conditioning circuit is selectively connectable to the second AWG 232 (or the second signal input 234) by the switches 272 and 273 located between the second AWG 232 and the second VGA 246, and is further connectable to the first AWG 230 (or the first signal input 233) by the switches 271 and 273 between the first AWG 230 and the first VGA 241. That is, the inclusion of the additional switch 273 enables both the first and second signal conditioning circuits 240 and 245 to be connected to the first AWG 230 (or the first signal input 233), so that one RF signal source may be used to provide the first calibration signal to both the first and second deskew probe points 110 and 120.

The deskew fixture 200 further includes a switch 274 that selectively connects the second delay line 247, the filter 248 and the second risetime converter 249 to an output of the first VGA 241, thus bypassing the second VGA 246. The switch 274 enables both the first signal conditioning circuit 240 and a portion of the second signal conditioning circuit 245, following the second VGA 246, to be connected to the first AWG 230 (or the first signal input 233) and the first VGA 241, so that one RF signal source and one amplifier may be used to provide the first calibration signal to both the first and second deskew probe points 110 and 120. In alternative embodiments, the deskew fixture 200 may not include the switch 273 and/or the switch 274, in which case the first AWG 230 (or the first signal input 233) is dedicated to the first signal conditioning circuit 240 and the second AWG 232 (or the second signal input 234) is dedicated to the second signal conditioning circuit 245, without departing from the scope of the present teachings.

The first and second VGAs 241 and 246 may be separately controllable by the processing unit 150 to vary amplification of the respective first and second calibration signals. As mentioned above, the first and second VGAs 241 and 246 may amplify current of the calibration signals, for example, so increased windings may be excluded from the deskew fixture 200 that otherwise would be necessary to increase the current to levels sufficient to perform the deskew measurement and calibration. Reduction in windings avoids unwanted inductance, which would interfere with performance of the deskew fixture 200. Also, the first and second VGAs 241 and 246 may have different amplification requirements, depending on characteristics of the first and second probes 115 and 125. For example, when the first probe 115 is a voltage probe and the second probe 125 is a current probe with high attenuation, and the second VGA 246 is configured to provide a higher output current than the first VGA 241, making the second VGA 246 more suitable for the high attenuation. In alternative embodiments, the first and second VGAs 241 and 246 may be implemented as amplifiers with no variable gain, in which case the first and second calibration signals are amplified by fixed amounts.

The first and second delay lines 242 and 247 are configured to delay one or both of the first and second calibration signals being applied to the first and second deskew probe points 110 and 120, respectively. The delays implemented by the first and second delay lines 242 and 247 may be fixed, or may be controllable by the processing unit 150, for example. Delaying one or both of the first and second calibration signals substantially aligns the first and second calibration signals in the time domain, which may reduce skew at the first and second deskew probe points 110 and 120 in addition to the skew correction by the feedback loop implemented using the processing unit 150.

The first and second filters 243 and 248 may be any type of filter to limit the frequency and/or bandwidth of the first and second calibration signals, respectively. The first and second filters 243 and 248 are typically incorporated when one AWG (e.g., the first AWG 230) is used to generate both the first and second calibration signals. For example, the first and second filters 243 and 248 may be low pass filters that condition the first and second calibration signals to be within the bandwidths of the first and second probes 115 and 125, respectively. Alternatively, the first and second filters 243 and 248 may be band pass filters that remove DC components and otherwise assure the first and second calibration signals are within the bandwidths of the first and second probes 115 and 125. The first and second filters 243 and 248 may be adjustable filters, controllable by the processing unit 150. For example, the cut-off frequencies for the band pass filters or low pass filters may be adjusted in response to the types of probes being used (e.g., as the first and second probes 115 and 125).

The first and second risetime converters 244 and 249 are configured to adjust pulsed edge risetimes of the first and second calibration signals for different bandwidths of the first and second probes 115 and 125. The first and second risetime converters 244 and 249 are essentially low pass filters (as discussed above) with different frequency responses, as would be apparent to one of ordinary skill in the art. The first and second risetime converters 244 and 249 may be controlled by the processing unit 150.

The conditioned first and second calibration signals are provided to the first and second deskew probe points 110 and 120, respectively, while the first and second probes 115 and 125 are in contact with the first and second deskew probe points 110 and 120. The first ADC 118 samples and digitizes the first calibration signal at the first deskew probe point 110, and provides the digitized first calibration signal to the processing unit 150, thus forming a first feedback loop 251, e.g., for controlling the first AWG 230 and the first signal conditioning circuit 240. The second ADC 128 samples and digitizes the second calibration signal at the second deskew probe point 120, and likewise provides the digitized second calibration signal to the processing unit 150, thus forming a second feedback loop 252, e.g., for controlling the second AWG 232 and the second signal conditioning circuit 245.

Figure 3:
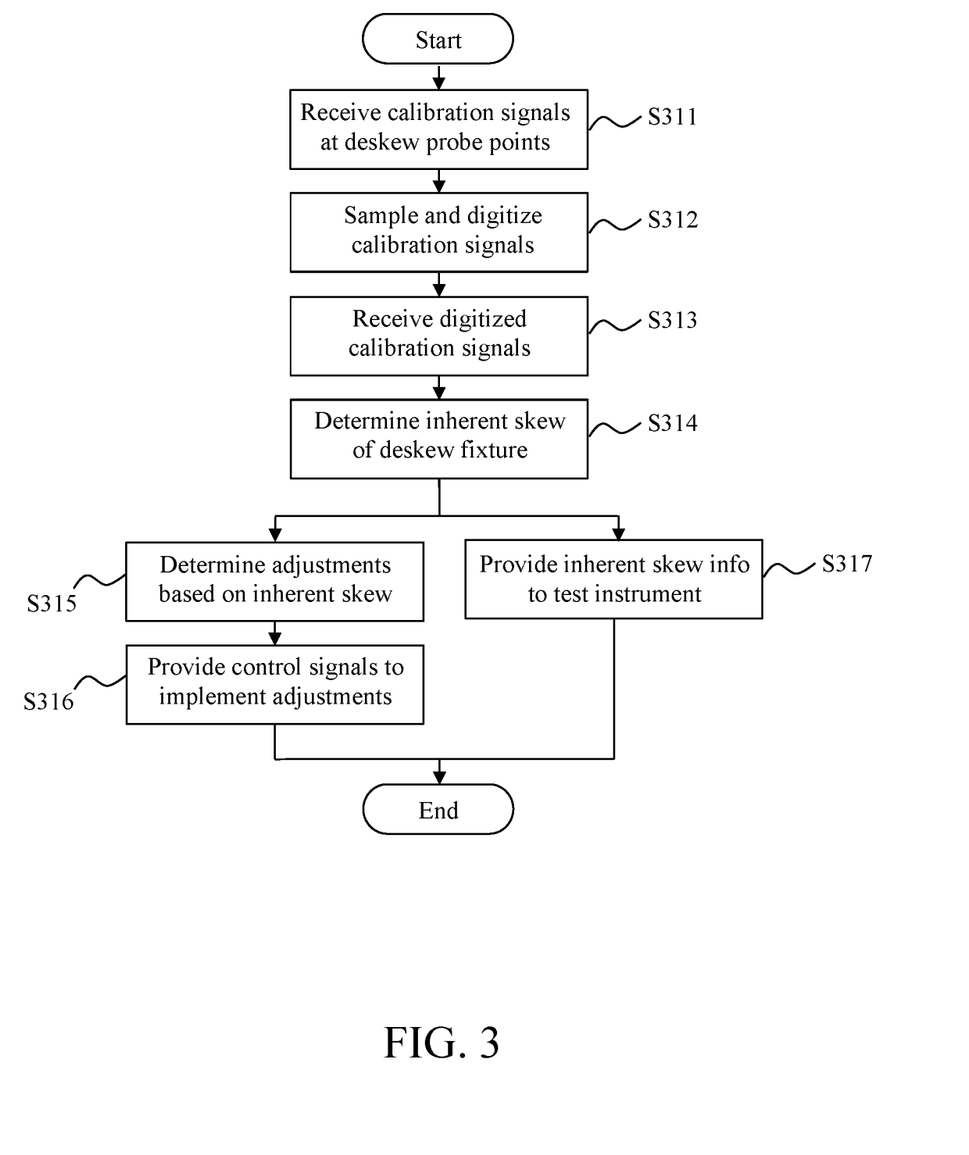
FIG. 3 is a simplified flow diagram of a method of deskewing a deskew fixture with self-calibration, according to a representative embodiment.

FIG. 3 is a simplified flow diagram of a method of deskewing a deskew fixture with self-calibration, according to a representative embodiment. As discussed above, the deskew fixture includes at least two deskew probe points (e.g., first and second deskew probe points 110 and 120) with corresponding ADCs (e.g., first and second ADCs 118 and 128) for digitizing calibration signals received at the deskew probe points. The deskew fixture also includes a processing unit (e.g., processing unit 150) that performs signal processing steps of the flow diagram.

Referring to FIG. 3, calibration signals are received at the deskew probe points in block S311, while probes to be calibrated are in contact with the deskew probe points, respectively. The deskew probe points may receive the same calibration signal from one signal generating circuit different calibration signals from separate signal generating circuits, as discussed above, where at least one of the signal generating circuits is integrated with the deskew fixture. In block S312, the calibration signals at the deskew probe points are sampled and digitized by ADCs, respectively.

The digitized calibration signals are received by the processing unit in block S313, along with timing information, and the inherent skew of the deskew fixture is determined in block S314. For example, the processing unit may receive the digitized calibration signals (samples) from the ADCs, and resolve the two digitized calibration signals in time. For example, assuming the calibration signals are pulses, and pulses at the second deskew probe point occur 1 ns after the respective pulses at the first deskew probe point, the processing unit is able to determine the skew between the first and second probe points by comparing the time difference between the pulses of the two digitized calibration signals. The timing differences may be due to the physical separation of the deskew probe points from one another, from the signal generating circuit(s), and from the processing unit, for example.

In block S315, one of more adjustments to be made to one or more components of the deskew fixture are determined in order to reduce or eliminate the determined inherent skew. The adjustments are implemented in block S316 in response to control signal(s) provided by the processing unit. For example, when a delay line of the signal conditioning circuit is included in one of the signal paths to the deskew probe points, the processing unit may determine an amount of delay adjustment is needed to compensate for the detected inherent skew. The delay adjustment causes the calibration signals to be received at the deskew probe points substantially simultaneously, or to the extent skew is introduced after the deskew probe points, the delay adjustment may cause the calibration signals to be received at the deskew probe points at different times.

Meanwhile, in block S317, the determined inherent skew is provided to a test instrument (e.g., test instrument 160). The test instrument is configured to perform a known deskew algorithm during calibration in order to deskew the probes for subsequent testing. The test instrument is able to compensate for any inherent skew of the deskew fixture using the determined skew provided by the processing unit. In various embodiments, the method may include performing blocks S315, S316 and/or block S317.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A deskew fixture for improving accuracy of a deskew calibration of a first probe and a second probe, performed by a test instrument, to be used in measuring electrical parameters of a device under test (DUT), the deskew fixture comprising:
   a first deskew probe point configured to receive a first calibration signal while contacting the first probe;
   a second deskew probe point configured to receive a second calibration signal while contacting the second probe; and
   a feedback loop for automatically self-calibrating the deskew fixture, the feedback loop comprising:
      a first analog to digital converter (ADC) configured to digitize the first calibration signal at the first deskew probe point to provide a first digitized calibration signal;

a second ADC configured to digitize the second calibration signal at the second deskew probe point to provide a second digitized calibration signal; and a processing unit programmed to determine inherent skew of the deskew fixture between the first and second skew probe points using the first and second digitized calibration signals, and to adjust timing of at least one of the first calibration signal or the second calibration signal.

2. The deskew fixture of claim 1, further comprising:
at least one signal generating circuit for generating the first and second calibration signals received by the first deskew probe point and the second deskew probe point.

3. The deskew fixture of claim 2, wherein the at least one signal generating circuit comprises a first signal generating circuit and a second signal generating circuit, and wherein the first calibration signal is generated by the first signal generating circuit and the second calibration signal is generated by the second signal generating circuit.

4. The deskew fixture of claim 3, further comprising:
a switch configured to selectively connect one of the first signal generating circuit and the second signal generating circuit to the second deskew probe point, while the first signal generating circuit remains connected to the first deskew probe point.

5. The deskew fixture of claim 2, further comprising:
at least one variable gain amplifier (VGA) connected between the at least one signal generating circuit and the first deskew probe point, and configured to amplify at least one of the first calibration signal or the second calibration signal.

6. The deskew fixture of claim 2, wherein the at least one signal generating circuit comprises at least one arbitrary waveform generator (AWG).

7. The deskew fixture of claim 2, further comprising:
a synchronized clock configured to provide synchronized between the at least one signal generating circuit and each of the first and second ADCs.

8. The deskew fixture of claim 1, wherein the processing unit is further programmed to provide the determined inherent skew to the test instrument for use in the deskew calibration of the first probe and the second probe.

9. The deskew fixture of claim 1, further comprising:
a signal conditioning circuit connected to at least one of the first or second deskew probe points, and configured to adjust the timing of the at least one of the first calibration signal or the second calibration signal in response to a control signal from the processing unit.

10. The deskew fixture of claim 9, wherein the signal conditioning circuit comprises at least one delay circuit configured to delay at least one of the first calibration signal or the second calibration signal to adjust the timing of the at least one of the first calibration signal or the second calibration signal in response to a control signal from the processing unit.

11. The deskew fixture of claim 9, wherein the signal conditioning circuit comprises one or more of:
at least one filter configured to adjust a bandwidth of at least one of the first calibration signal or the second calibration signal to correspond to a first bandwidth of the first probe or a second bandwidth of the second calibration signal to correspond to a second bandwidth of the second probe, respectively; and.
at least one risetime converter configured to adjust a bandwidth of at least one of the first calibration signal or the second calibration signal.

12. The deskew fixture of claim 1, wherein each of the first deskew probe point and the second deskew probe point is modular, enabling removal and replacement of the first deskew probe point and the second deskew probe point depending on types and bandwidths of the first probe and the second probe, respectively.

13. The deskew fixture of claim 12, wherein the processing unit is further programmed to identify the modular first and second deskew probe points, and to automatically configure the identified modular first and second deskew probe points accordingly.

14. A deskew fixture for improving accuracy of a deskew calibration of a first probe and a second probe, performed by a test instrument, to be used in measuring electrical parameters of a device under test (DUT), the deskew fixture comprising:
a base;
a first modular deskew probe point removably connected to the base, and configured to contact the first probe during the deskew calibration, the first modular deskew probe point being customized according to geometrical and radio frequency (RF) characteristics of the first probe;
a second modular deskew probe point removably connected to the base, and configured to contact the second probe during the deskew calibration, the second modular deskew probe point being customized according to geometrical and RF characteristics of the second probe;
at least one signal generating circuit on the base for generating at least one calibration signal, respectively, provided to the first modular deskew probe point and the second modular deskew probe point;
a first analog to digital converter (ADC) configured to digitize the at least one calibration signal at the first modular deskew probe point with the first probe contacting the first modular deskew probe point, to provide a first digitized calibration signal;
a second ADC configured to digitize the at least one calibration signal at the second modular deskew probe point with the second probe contacting the second modular deskew probe point, to provide a second digitized calibration signal; and
a processing unit programmed to determine skew between the first and second modular deskew probe points using the first digitized calibration signal and the second digitized calibration signal.

15. The deskew fixture of claim 14, wherein the at least one signal generating circuit generates the at least one calibration signal in response to signal generation and signal conditioning input from the test instrument.

16. The deskew fixture of claim 14, wherein the processing unit is further programmed to provide the determined skew to the test instrument for use in the deskew calibration of the first probe and the second probe performed by the test instrument.

17. The deskew fixture of claim 14, further comprising:
a signal conditioning circuit connected between the at least one signal generating circuit and at least one of the first and second modular deskew probe points, and configured to adjust timing of the at least one calibration signal,
wherein the processing unit is further programmed to control the signal conditioning circuit to adjust the timing of the at least one calibration signal based on the determined skew.

18. A deskew fixture for improving accuracy of a deskew calibration of a first probe and a second probe, performed by a test instrument, to be used in measuring electrical parameters of a device under test (DUT), the deskew fixture comprising:
- a first deskew probe point configured to receive a first calibration signal while contacting the first probe;
- a second deskew probe point configured to receive a second calibration signal while contacting the second probe;
- a first analog to digital converter (ADC) configured to digitize the first calibration signal at the first deskew probe point to provide a first digitized calibration signal; and
- a second ADC configured to digitize the second calibration signal at the second deskew probe point to provide a second digitized calibration signal,
- wherein deskew information is provided by the deskew fixture to the test instrument for use in the deskew calibration of the first probe and the second probe, wherein the test instrument adjusts the deskew calibration using the deskew information to compensate for inherent skew of the deskew fixture.

19. The deskew fixture of claim 18, further comprising:
a processing unit programmed to determine the inherent skew of the deskew fixture using the first and second digitized calibration signals, and to provide the deskew information, including the determined inherent skew, to the test instrument for use in the deskew calibration of the first probe and the second probe.

20. The deskew fixture of claim 18, wherein the deskew information includes the first and second digitized calibration signals, and the test instrument determines the inherent skew of the deskew fixture using the first and second digitized calibration signals from the deskew information.

* * * * *